United States Patent [19]
Zirngibl

[11] Patent Number: 5,610,095
[45] Date of Patent: Mar. 11, 1997

[54] MONOLITHICALLY INTEGRATED CIRCUITS HAVING DIELECTRICALLY ISOLATED, ELECTRICALLY CONTROLLED OPTICAL DEVICES AND PROCESS FOR FABRICATING THE SAME

[75] Inventor: Martin Zirngibl, Middletown, N.J.

[73] Assignee: Lucent Technologies Inc., Murray Hill, N.J.

[21] Appl. No.: 298,705

[22] Filed: Aug. 31, 1994

[51] Int. Cl.⁶ .................................................. H01L 21/20
[52] U.S. Cl. .......................... 437/129; 437/127; 117/919; 117/923
[58] Field of Search ................................... 437/129, 127; 117/913, 923

[56] References Cited

U.S. PATENT DOCUMENTS

| | | | |
|---|---|---|---|
| 4,661,960 | 4/1987 | Hirayama et al. | 372/45 |
| 4,777,516 | 10/1988 | Deschler et al. | 357/17 |
| 5,250,462 | 10/1993 | Sasaki et al. | 437/129 |
| 5,436,193 | 7/1995 | Beernik et al. | 437/129 |
| 5,470,786 | 11/1995 | Iirikawa et al. | 437/129 |

FOREIGN PATENT DOCUMENTS 03283689  12/1991  Japan.
06029617  2/1994  Japan.

OTHER PUBLICATIONS

Zirngibl, Martin et al., "12 frequency WDM laser based on a transmissive waveguide grating router", *Electronics Letters*, vol. 30, No. 9, (Apr. 28, 1994), pp. 701–702.

Zirngibl, Martin et al., "High performance, 12 frequency optical multichannel controller", *Electronics Letters*, vol. 30, No. 9, (Apr. 28, 1994), pp. 700–701.

Zirngibl, Martin et al., "Digitally Tunable Channel Dropping Filter/Equalizer Based on a Waveguide Grating Router and Optical Amplifier Integration", *IEEE Photonics Technology Letters*, vol. 6, No. 4, (Apr. 1994) pp. 513–515.

*Primary Examiner*—Robert Kunemund

[57] ABSTRACT

A fabrication technique for improved dielectric isolation of adjacent, electronic devices or electrically controllable optical devices provides an inter-device resistance in excess of 1 MΩ. Strips of a silicon oxide material, such as $SiO_2$, are formed between the devices after device formation but prior to regrowth of an electrically conductive cap layer and subsequent metallization. The presence of the $SiO_2$ strips prevents regrowth of the cap layer between the adjacent devices.

10 Claims, 2 Drawing Sheets

5,610,095

MONOLITHICALLY INTEGRATED CIRCUITS HAVING DIELECTRICALLY ISOLATED, ELECTRICALLY CONTROLLED OPTICAL DEVICES AND PROCESS FOR FABRICATING THE SAME

FIELD OF THE INVENTION

The present invention relates generally to monolithically integrated circuit devices and, more particularly, to circuits having dielectrically isolated electronic devices, optoelectronic devices, or both formed thereon and to a process for fabricating the same.

BACKGROUND OF THE INVENTION

New structures and fabrication processes promise to boost performance and reduce the cost of optoelectronic ICs, which convert electrical signals representing voice, data, and video to and from light. The greatest advantage of optoelectronic chips lies in their data-transfer rates—potentially up to about 5 gigabits per second, far higher than what discrete optical and electronic components allow. Such high speeds can be obtained with low noise, amounting to about 1 error in 1 billion to 10 billion bits. In addition, a single optoelectronic IC can take on many functions—for example, light-emitting and light-receiving devices handling several different wavelengths for multichannel communications, along with related signal-processing functions.

Monolithic integration of semiconductor amplifiers together with optical multiplexers can be used to build light sources for wavelength division multiplexed (WDM) systems that are capable of producing a comb of exactly spaced frequencies. For economical application of monolithic integration to such an application, however, it is necessary to dielectrically isolate the adjacent optical amplifiers. In a paper entitled "Digitally Tunable Channel Dropping Filter/Equalizer Based on Waveguide Grating Router and Optical Amplifier Integration" (IEEE Photonics Technology Letters, Vol. 6, No. 4, April 1994), M. Zirngibl, C. H. Joyner, and B. Glance evaluated a tunable filter consisting of an array of waveguide grating multiplexers monolithically integrated with semiconductor optical amplifiers on an n+InP substrate. The optical amplifiers are integrated on both sides of the wavelength grating router and are spaced approximately 125 μm apart on each side. A transverse cross sectional view of the tunable filter 1, showing the arrangement of adjacent optical amplifiers, is shown in FIG. 1.

Each optical amplifier comprises a doped section of waveguide with controllable optical transmissivity. The doping is such that an appropriately configured semiconductor junction is defined in each optical amplifier. These sections are optically active in that application of electrical energy to those sections will cause them to become transmissive to the flow of optical energy and will even provide some degree of gain to optical signals flowing through them. When electrical bias current above a predetermined threshold is applied, lasing action begins. These doped sections of waveguide are substantially opaque to the transmission of light when there is no applied electrical stimulation.

As shown in FIG. 1, laser cavity active regions are formed of quantum wells (QW), 2, 3 and bandgap barriers 4, 5 lattice matched to InP. Semi-insulating regions 6 are provided between the amplifiers 7. A heavily doped p+ cap layer 8 serves as the contact layer and has metallized contacts 9 formed thereon.

In the aforementioned paper, it was reported that electrical isolation between adjacent optical amplifiers was only 50 Ω. Significant crosstalk and power penalties, as evidenced by sidelobes in a graphical representation of output power versus input wavelength, can be attributed to weak electrical isolation. Ion implantation of impurities into the cap layer might be employed to create hole-filled isolating regions. However, such a technique is only expected to yield an inter-device resistance on the order of several kΩ. Of course, implantation requires additional mask layers and other processing steps, which steps may be destructive to other components. It is also anticipated that some of the impurities may diffuse into the underlying InP layer during implantation, thereby causing the InP layer to act as an attenuator.

SUMMARY OF THE INVENTION

In view of the foregoing disadvantages associated with the prior art, there is a need for a reliable technique for dielectrically isolating adjacent, monolithically integrated electronic devices, optoelectronic devices, or combinations thereof. A monolithically integrated opto-electronic circuit constructed in accordance with the present invention, for example, comprises a compound semiconductor surface having a plurality of electrically controllable optical devices fabricated thereon with regions of semi-insulating material disposed between the electrically controllable optical devices. Each region has a strip of dielectric material disposed thereon, and a cap layer of conductive semiconductor material is disposed over the optical devices and semi-insulating material.

The cap layer defines at least one channel between adjacent electrically controllable optical devices, the channels being disposed above a corresponding dielectric strip. These channels prevent leakage of current between the adjacent optical devices via the cap layer.

In accordance with an illustrative embodiment of the present invention, the electrically controllable optical devices are optical amplifiers. Each amplifier includes a doped section of waveguide with electrically controllable optical transmissivity, the doped section defining a semiconductor junction. An example of a circuit which employs such amplifiers is a tunable laser, which typically includes first and second groups of optical amplifiers and a frequency router.

The fabrication technique of the present invention may be utilized to provide a resistance in excess of 1 MΩ between adjacent optical devices. For this purpose, strips of a dielectric material, such for example as $SiO_2$, are formed between the devices prior to growth of a cap layer and metallization. Thus, a process for fabricating a monolithically integrated optoelectronic circuit comprises the steps of forming a plurality of electrically controllable optical devices on a compound semiconductor surface; defining at least one region of semi-insulating material between adjacent optical devices, each region having a strip of dielectric material disposed thereon, to electrically isolate the optical devices from one another; and epitaxially growing a cap layer of compound semiconductor material over the optical devices. In order to provide the isolating channels in the cap layer, the dielectric material comprising the strips is selected such that the cap layer will not grow thereon.

The forming step includes defining the optical devices from a plurality of device layers epitaxially grown on the compound semiconductor surface. Semi-insulating regions of a compound semiconductor material are grown between optical devices to be isolated, dielectric strips are deposited or otherwise formed on the semi-insulating regions, and a cap layer of a compound semiconductor material is then regrown over the semi-insulating regions and the optical devices. The cap layer is then metallized to facilitate electrical connections in accordance with conventional fabrication techniques.

An illustrative monolithically integrated optoelectronic device is fabricated on a compound semiconductor surface such as n+ doped InP by epitaxially growing a plurality of optical amplifiers thereon. A graded waveguide layer is grown on the compound semiconductor surface which may, for example, be comprised of InGaAsP grown by metalorganic vapor phase epitaxy. An active laser cavity layer comprising InGaAsP quantum wells is grown above the graded waveguide layer. The optical devices may then be formed from the graded waveguide layer and the active laser cavity layer by a suitable etching process, e.g. wet-chemical etching. The semi-insulating regions or strips are then grown, deposited, or otherwise formed on the semi-insulating regions. After the isolating strips have been formed, a cap layer of a compound semiconductor material is epitaxially grown and metallized to facilitate electrical interconnections to the optical amplifiers.

Other features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims.

DETAILED DESCRIPTION OF THE DRAWINGS

In the drawings, wherein like reference characters denote similar elements throughout the several views.

DETAILED DESCRIPTION OF THE PRESENTLY PREFERRED EMBODIMENTS

Initially, it should be emphasized that although the processing steps of the present invention are described in connection with the fabrication of a tunable router utilizing optoelectronic devices (i.e., optical amplifiers), it is contemplated that the process may be utilized to dielectrically isolate any electronic components utilizing epitaxial growth and regrowth processing techniques.

In any event, and as indicated above, the method of the present invention may be advantageously employed in the fabrication of integrated tunable lasers such as the one described in commonly-owned copending patent application Ser. No. 08/019,952, filed on Jun. 17, 1994 and entitled Rapidly Tunable Integrated Optical Filter, the disclosure of which patent application is expressly incorporated herein by reference. In the aforementioned application, there is disclosed a tunable laser which includes a frequency routing device for providing frequency selectivity, a number of waveguides for carrying optical signals, and a number of optically active sections for providing optical amplification and lasing behavior.

Figure 1:
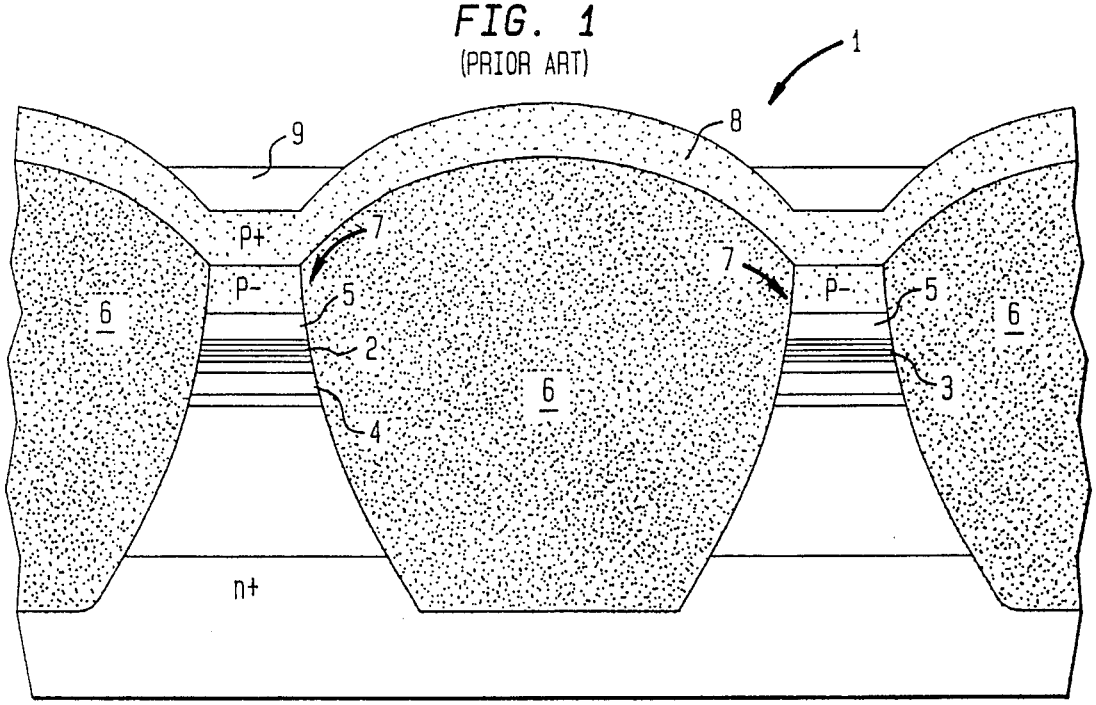
FIG. 1 is a cross-sectional view of a conventional monolithically integrated optoelectronic chip in which adjacent circuit components are not dielectrically isolated.
Figure 2:
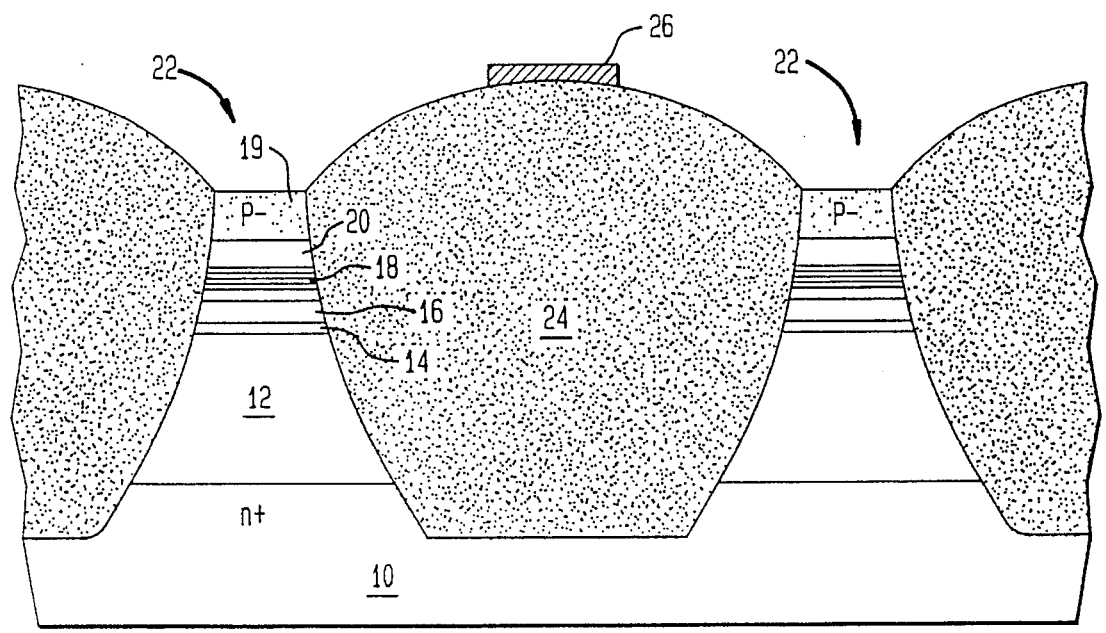
FIG. 2 is a cross-sectional view of an illustrative monolithically integrated optoelectronic IC having an SiO$_2$ strip patterned between doped regions to be isolated in accordance with the present invention.
Figure 3:
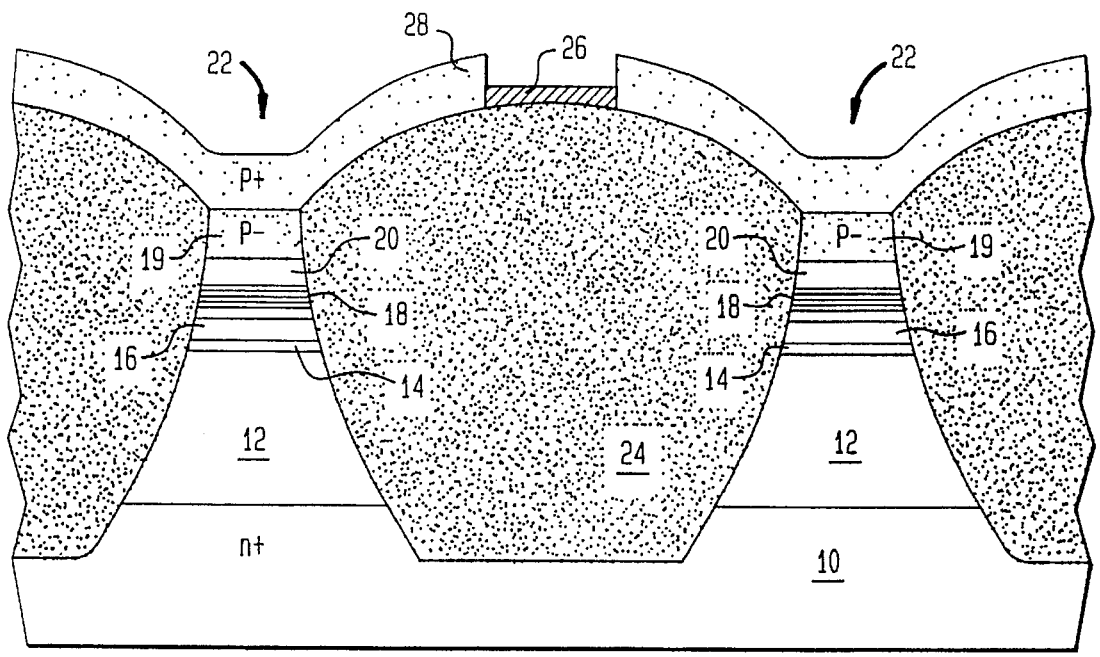
FIG. 3 is a cross-sectional view depicting epitaxial regrowth over the isolated doped regions of the monolithically integrated optoelectronic IC of FIG. 2 in accordance with the present invention.
Figure 4:
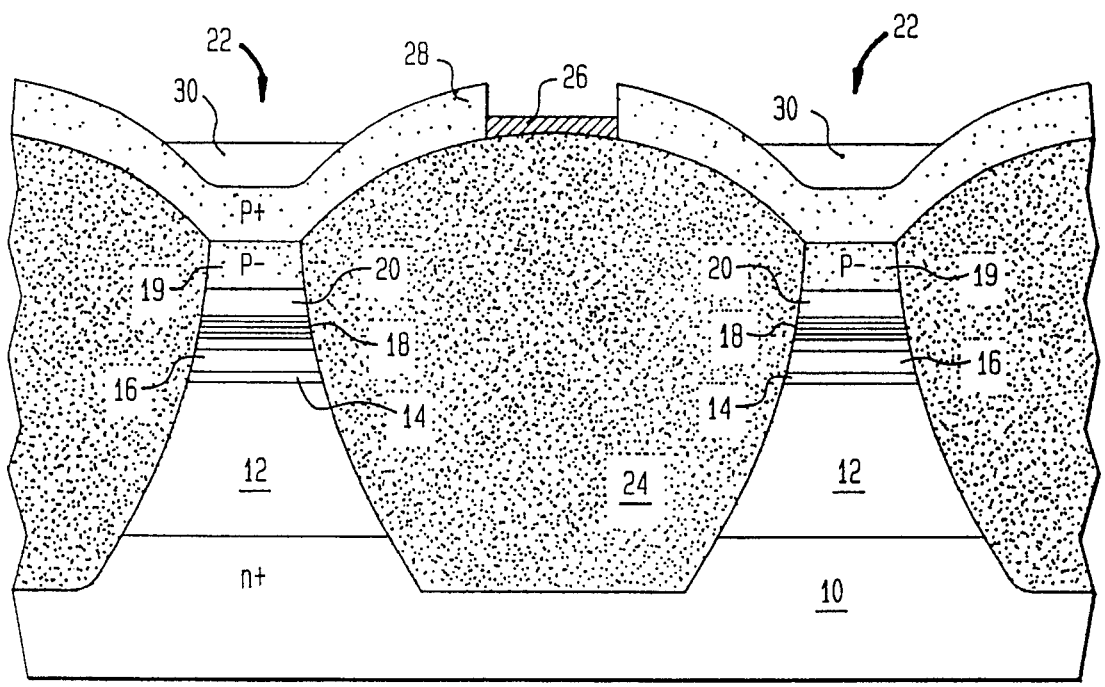
FIG. 4 is a cross-sectional view depicting the monolithically integrated optoelectronic IC of FIG. 3 after contact metallization.

With reference now to FIGS. 2–4, there are illustrated a sequence of processing steps for fabricating a monolithically integrated circuit having dielectrically isolated optical devices formed thereon. FIG. 2 illustrates a wafer or substrate 10 made of a compound semiconductive material such, for example, as indium phosphide (InP) doped to a first conductivity (n+ in the illustrative example). Illustratively, an InP substrate doped with S to an impurity concentration of $2 \times 10^{18}/\text{cm}^3$ and having a thickness on the order of 500 µm may be employed.

To achieve the structure of FIG. 2, epitaxial growth and regrowth are performed, with conventional photolithographic procedures being utilized for device fabrication. As will be readily appreciated by those skilled in the art, crystals for ICs can be grown in a number of ways: e.g. liquid-phase epitaxy (LPE), vapor-phase epitaxy (VPE), metal-organic-vapor-phase epitaxy (MOVPE) or molecular beam epitaxy (MBE). Briefly, LPE is a mature technique that yields high-quality epitaxial layers; however, its application is limited to wafers of less than 40 square millimeters. Because VPE can produce very pure semiconductor layers, as in p-i-n diodes, it is widely used for receiving devices; with this technique, however, the thickness of very thin films is difficult to control. With MOVPE and MBE, on the other hand, the thickness of the layer is easy to control.

Illustratively, the continuously graded layer 12 of the rib waveguide structure may be fabricated by low pressure (100 torr) MOVPE of an indium phosphide based material, such as InGaAsP. The graded structure is achieved by ramping the Group III organometallic flows, as well as arsine, through three intermediate compositions to cover the desired band-gap (for example, 1.10 to 1.35 µm). Optical devices such as optical amplifiers may then be grown thereon. To fabricate such an amplifier, the active region of the laser cavity must first be formed. A buffer layer 14 of InP is grown. A first barrier 16 lattice matched to InP layer 14 may then be formed of a material having the desired bandgap. In the illustrative embodiment, barrier 16 is formed by growing a 1.35 µm bandgap region of InGaAsP. Similarly, quantum wells (QW) 18, illustratively 1.58 µm InGaAsP, are grown in a conventional manner on first barrier 16. Subsequently, a second barrier 20 having the same properties as first barrier 16 is grown over the quantum wells. For exemplary purposes, diethyl zinc and disilane, respectively, may be employed as the p- and n-type dopant impurities. A first layer 19 of compound semiconductor material having a first conductivity, illustratively p-InP, is grown on the surface of second barrier 20.

Once the layers which will be used to fabricate the active regions have been formed on substrate or wafer 10—to a thickness, for example, of several µm—the passive waveguides and amplifier sections may be defined by conventional patterning and etching techniques such, for example, as wet chemical etching. Subsequently, a layer of semi-insulating material, InP(Fe) in the illustrative example, is grown everywhere except on the upper surface of the optical amplifier sections 22. As will be readily appreciated by those skilled in the art, iron doping renders the InP non-conducting. The resulting configuration of isolated, mesa-shaped amplifier sections 22 and semi-insulating regions 24 is shown in FIG. 2. Isolating strips 26, only one of which is shown in FIG. 2, are then deposited or otherwise formed between adjacent amplifier sections 22 on the surface of corresponding semi-insulating regions, such as region 24.

With continued reference to FIG. 2, dielectric isolation between adjacent optical amplifying devices, which may have a center-to-center spacing on the order of 125 µm, is obtained in accordance with the present invention by depositing or otherwise forming thin strips 26 (only one of which is shown in FIG. 2) of $SiO_x$ on the surface of semi-insulating regions 22. Illustratively, employing strips formed of silicon dioxide ($SiO_2$) having a width of 20 µm will result in a structure having an inter-device resistance on the order of 1 MΩ.

After the isolating strips have been formed, a cap layer 28 of a heavily doped compound semiconductor material, illustratively p+ InP, is epitaxially regrown over the exterior surface of the optical amplifiers and semi-insulating regions 24 to facilitate metallization. The cap layer may, by way of example, be on the order of 1 µm. As will be readily apparent to those skilled in the art, the cap layer will not grow over the sections covered by $SiO_2$. The resulting structure is depicted in FIG. 3. As shown in FIG. 4, metallization may now be performed to provide suitable electrical contacts 30 for the optical amplifiers.

While there have been shown and described and pointed out fundamental novel features of the invention as applied to preferred embodiments thereof, it will be understood that various omissions and substitutions and changes in the form and details of the disclosed invention may be made by those skilled in the art without departing from the spirit of the invention. It is the intention, however, therefore, to be limited only as indicated by the scope of the claims appended hereto.

What is claimed is:

1. A process for fabricating a monolithically integrated optoelectronic circuit, comprising the steps of:

forming a plurality of electrically controllable optical devices on a compound semiconductor surface;

defining at least one region of semi-insulating material between adjacent optical devices, each region having a strip of dielectric material disposed thereon, to electrically isolate said optical devices from one another; and epitaxially growing a cap layer of compound semiconductor material over said optical devices, said dielectric material being selected such that said cap layer will not grow thereon.

2. The process of claim 1, wherein said forming step includes a step of epitaxially growing a plurality of optical amplifiers on said compound semiconductor surface.

3. The process of claim 2, wherein said forming step includes the step of growing a graded waveguide layer on said compound semiconductor surface.

4. The process of claim 3, wherein said graded waveguide layer comprises InGaAsP grown by metalorganic vapor phase epitaxy.

5. The process of claim 3, wherein said forming step further includes a step of epitaxially growing an active laser cavity layer above said graded waveguide layer.

6. The process of claim 5, wherein said active laser cavity region comprises InGaAsP quantum wells.

7. The process of claim 5, wherein said forming step further includes defining said optical devices from said graded waveguide layer and said active laser cavity layer by wet-chemical etching.

8. The process of claim 1, wherein said forming step includes defining said optical devices from a plurality of device layers epitaxially grown on said surface.

9. A process for fabricating a monolithically integrated electronic circuit, comprising the steps of:

forming a plurality of electronic devices on a semiconductor surface;

defining at least one region of semi-insulating material between adjacent electronic devices, each region having a strip of dielectric material disposed thereon, to electrically isolate said electronic devices from one another; and epitaxially growing a cap layer of semiconductor material over said electronic devices, said dielectric material being selected such that said cap layer will not grow thereon.

10. The process of claim 9, wherein a plurality of electrically controllable optical devices are fabricated during said forming step.

\* \* \* \* \*